US006917243B2

(12) United States Patent
Doherty et al.

(10) Patent No.: US 6,917,243 B2
(45) Date of Patent: Jul. 12, 2005

(54) INTEGRATED POWER AMPLIFIER CIRCUIT

(75) Inventors: Mark Doherty, Westford, MA (US); John Gillis, Tewksbury, MA (US); Michael McPartlin, North Andover, MA (US); David Helms, Tyngsboro, MA (US); Phillip Antognetti, Chelmsford, MA (US)

(73) Assignee: SiGe Semiconductor Inc., Ottawa (CA)

( * ) Notice: Subject to any disclaimer, the term of this patent is extended or adjusted under 35 U.S.C. 154(b) by 25 days.

(21) Appl. No.: 10/607,122

(22) Filed: Jun. 27, 2003

(65) Prior Publication Data

US 2004/0263247 A1 Dec. 30, 2004

(51) Int. Cl.[7] .............................. H03G 5/16; H03F 3/04
(52) U.S. Cl. ...................... 330/133; 330/296; 330/310
(58) Field of Search ................................ 330/133, 296, 330/310

(56) References Cited

U.S. PATENT DOCUMENTS

| 4,510,460 | A | | 4/1985 | Tamura |
| 5,477,188 | A | | 12/1995 | Chawla et al. |
| 5,497,125 | A | | 3/1996 | Royds |
| 6,194,968 | B1 | * | 2/2001 | Winslow ................... 330/289 |
| 6,236,266 | B1 | * | 5/2001 | Choumei et al. ............ 330/133 |
| 6,639,470 | B1 | * | 10/2003 | Andrys et al. ............... 330/296 |
| 6,701,138 | B2 | * | 3/2004 | Epperson et al. ......... 455/127.3 |
| 6,727,754 | B2 | * | 4/2004 | Dupuis et al. .............. 330/254 |

* cited by examiner

Primary Examiner—Patricia Nguyen
(74) Attorney, Agent, or Firm—Kenyon & Kenyon

(57) ABSTRACT

Prior art architectures of power amplifiers employ a substantial die area, and utilize multiple integrated circuit technologies with a net higher manufacturing cost and large associated packaging area. A new scheme is presented wherein several sense and control signals are used to provide fine and gross control over the key figures of merit associated with integrated semiconductor power amplifiers. How and where these sense and control signals are used is crucial to achieving the most manufacturable and most economic integrated amplifier. In accordance with a first embodiment of the invention, a Dual Feedback-Low power regulation circuit for a three-stage power amplifier integrated circuit is provided. In accordance with a second embodiment of the invention, a current source feedback circuit having low RF output signal power regulation for a three-stage power amplifier integrated circuit is provided. In accordance with a third embodiment of the invention, a detector circuit in the form of an integrated logarithmic current detector circuit in conjunction with a three stage power amplifier integrated circuit. The three embodiments of the invention advantageously overcome the limitations of the prior art.

37 Claims, 6 Drawing Sheets

INTEGRATED POWER AMPLIFIER CIRCUIT

FIELD OF THE INVENTION

The invention relates to the field of amplifier circuits, and more specifically to the field of integrated power amplifier circuits.

BACKGROUND OF THE INVENTION

Typical power amplifier (PA) technologies utilize multiple integrated circuits in order to provide functionality for amplification, power output control and for stabilization of the PA output signal level due to supply voltage and temperature fluctuations.

It is well appreciated to those skilled in the art of amplifier design that bias currents supplied to the RF signal amplification stages is are an important determinant of the performance of the amplification stages. For example, a bias current supplied to the base of a bipolar transistor acting as a RF signal amplification stage is a major determinant of the amplification performance demonstrated by that bipolar transistor. Selecting and supplying the correct bias current is crucial to optimizing the RF signal amplification characteristics of any transistor amplifier. Moreover, one can appreciate that having control over the bias current supplied to the transistor amplifiers can enable more sophisticated schemes for optimizing the power output characteristics of the transistor amplifier. For example, one might detect output power from a power amplifier and choose to modify the bias current in response to the measured output power. Furthermore, one can envisage other figures of merit associated with the performance of power amplifiers that might be optimized using control over the bias current, such as bias current reduction at lower output powers to improve operating efficiency when RF-induced rectification currents are low.

Of course, such a concept is not new to the art of power amplifier design or their utilization. Open-loop or close-loop control over the performance of a power amplifier through the bias current is well known to those of skill in the art. Moreover, closed loop control has been used to mitigate variations in power amplifier output power performance in response to input control voltages, external temperature changes, or simply to mitigate manufacturing tolerance.

Introducing a degree of control, however, over the performance of power amplifiers through the bias current entails using additional circuitry to convert voltage detection error signals into incremental base voltage changes on the transistors. That is, circuitry is required above and beyond the transistors used for providing RF signal amplification. For example, introducing control over the bias current will require, at a minimum, circuitry for receiving the control signal and for varying the bias current. Numerous circuit block architectures have been discussed in the prior art for achieving thereof.

Furthermore, all existing control architectures employ a substantial die area, and utilize multiple integrated circuit technologies with a net higher manufacturing cost and large associated packaging area. This traditional approach often results in a reduction in operating efficiency, due to the need for in-line coupling circuits, and poor repeatability of results, create more challenging calibration requirements and reduced manufacturing yields.

If is therefore an object of the invention to provide a power amplifier integrated circuit (PAIC) that overcomes the limitations of the prior art by fully integrating such bias and power control features on a single PAIC within a single manufacturing process technology. The PAIC advantageously realizes a reduced die and packaging area over existing solutions. Along with improved RF output signal power control repeatability versus temperature and supply voltage variations.

SUMMARY OF THE INVENTION

In accordance with the invention there is provided a power amplifier circuit comprising: an input port for receiving a RF input signal; an output port for providing therefrom a RF output signal, the RF output signal being an amplified version of the RF input signal; a supply voltage input port for receiving a supply voltage; a voltage regulator circuit for receiving the supply voltage and for providing a regulated supply voltage; a first amplification stage having a first gain and for receiving one of a signal derived from the RF input signal and the RF input signal and for providing a first amplified RF signal, the first amplification stage coupled to the voltage regulator circuit for receiving the regulated supply voltage; and, a second amplification stage having a second gain and coupled to the first amplification stage for receiving one of a signal derived from the first amplified RF signal and the first amplified RF signal and coupled to the output port for providing the output signal thereto, the second amplification stage coupled to the supply voltage input port for receiving the supply voltage other than regulated by the voltage regulator circuit.

In accordance with the invention there is provided a method of amplifying a RF input signal to form a RF output signal that is an amplified version of the RF input signal comprising the steps of: receiving the RF input signal; providing a first amplification stage having a first gain; providing a second amplification stage having a second gain; receiving a first supply voltage; regulating the first supply voltage to provide a regulated supply voltage; providing the regulated supply voltage to the first amplification stage; providing the first supply voltage to the second amplification stage; and, amplifying one of a signal derived from the received RF input signal and the received RF input signal using the first amplification stage having the first gain and the second amplification stage having the second gain to form the RF output signal.

In accordance with the invention there is provided a power amplifier circuit comprising: an input port for receiving a RF input signal; an output port for providing therefrom a RF output signal, the RF output signal being an amplified version of the RF input signal; a supply voltage input port for receiving a supply voltage; a voltage regulator circuit for receiving the supply voltage and for providing a regulated supply voltage; a first amplification stage having a first gain for receiving one of a signal derived from the RF input signal and the RF input signal and for providing a first amplified RF signal, the first amplification stage coupled to the voltage regulator circuit for receiving the regulated supply voltage; a second amplification stage having a second gain for receiving one of a signal derived from the first amplified RF signal and the first amplified RF signal and coupled to the output port for providing the output signal thereto, the second amplification stage coupled to the supply voltage input port for receiving the supply voltage, the supply voltage provided to the second amplification stage and other than regulated by the voltage regulator circuit; a temperature sensing circuit disposed for sensing a temperature of the power amplifier circuit and for providing a temperature signal therefrom in dependence upon the sensed temperature of the power amplifier circuit, the temperature signal for provision to the regulator circuit and at least one of the first amplification stage and the second amplification stage; a voltage sensing circuit disposed for sensing a potential of the supply voltage and for providing a sense signal in dependence thereon, the sense signal for provision to at least one of the regulator circuit and the first amplification stage and the second amplification stage; and, a control port coupled to at least one of the voltage regulator circuit and the first amplification stage and the second amplification stage for at least one of respectively controlling the regulated supply voltage and the first gain and the second gain.

In accordance with the invention there is provided a power amplifier circuit comprising: an input port for receiving a RF input signal; an output port for providing a RF output signal therefrom that is an amplified version of the RF input signal; a control port for receiving a control signal; a supply voltage input port for receiving a supply voltage; a temperature sensing circuit for sensing a temperature of the power amplifier circuit and for providing a temperature signal in dependence thereon; a voltage sensing circuit for sensing a potential of a voltage supply and for providing a sense signal in dependence thereon; a first amplification stage having a first gain for amplifying one of a signal derived from the RF input signal and the RF input signal to form a first amplified RF signal, the first amplification stage for receiving at least one of the temperature signal and the sense signal and the control signal and for varying the first gain in dependence thereon; and, a second amplification stage having a second gain for amplifying one of a signal derived from the first amplified RF signal and the first amplified RF signal to form the RF output signal, the second amplification stage for receiving the control signal and other than receiving at least one of the temperature signal and the sense signal for varying the second gain in dependence thereon.

In accordance with the invention there is provided a method of operating a multi amplification stage amplifier circuit comprising the steps of: receiving of a control signal having a control signal magnitude; providing a first amplification stage having a first gain; receiving one of a signal derived from a RF input signal and a RF input signal for amplification using the first amplification stage; amplifying the one of a signal derived from the RF input signal and the RF input signal using the first amplification stage to form a first amplified RF signal, the amplifying of the one of a signal derived from the RF input signal and the RF input signal performed in conjunction with a step of compensating of the first amplification stage for at least two of temperature and supply voltage and control signal magnitude; providing a second amplification stage having a second gain; receiving of the first amplified RF signal using the second amplification stage; and, amplifying one of a signal derived from the first amplified RF signal and the first amplified signal using the second amplification stage to form a RF output signal, the amplifying of the one of a signal derived from the first amplified RF signal and the first amplified signal performed in conjunction with a step of other than compensating of the second amplification stage for at least one of temperature and supply voltage fluctuations.

In accordance with the invention there is provided a power amplifier circuit comprising: an input port for receiving a RF input signal; an output port for providing a RF output signal therefrom that is an amplified version of the RF input signal; a control port for receiving a control signal; a supply voltage input port for receiving a supply voltage; a temperature sensing circuit for sensing a temperature of the power amplifier circuit and for providing a temperature signal in dependence thereon; a voltage sensing circuit for sensing a potential of a voltage supply and for providing a sense signal in dependence thereon; a first amplification stage having a first gain and for amplifying one of a signal derived from the RF input signal and the RF input signal to form a first amplified signal, the first amplification stage for receiving at least one of the temperature signal and the sense signal and the control signal and for varying the first gain in dependence thereon; and, a second amplification stage having a second gain and for amplifying one of a signal derived from the first amplified signal the first amplified signal, the second amplification stage for receiving at least one of the control signal and the temperature signal and the sense signal for varying the second gain in dependence thereon, the second amplification stage coupled directly to the supply voltage input port.

In accordance with the invention there is provided a method of operating a poly stage amplifier circuit comprising the steps of: providing of a first amplification stage having a first gain and for receiving one of a signal derived from a RF input signal and a RF input signal for amplification; amplifying the one of a signal derived from the RF input signal and the RF input signal using the first amplification stage to form a first amplified signal, the amplifying of the one of a signal derived from the RF input signal and the RF input signal performed in conjunction with a step of compensating of the first amplification stage for at least one of temperature and supply voltage fluctuation and control signal magnitude; providing of a second amplification stage having a second gain and for receiving one of a signal derived from the first amplified signal and the first amplified signal; supplying the supply voltage to the second amplification stage without a substantial voltage drop between a potential of the supply voltage and that received by the second amplifying stage; and, amplifying the signal derived from the first amplified signal and the first amplified signal using the second amplification stage to form a RF output signal, the amplifying of the signal derived from the first amplified signal and the first amplified signal performed in conjunction with a step of compensating of the second amplification stage for at least one of temperature and supply voltage fluctuations.

In accordance with the invention there is provided an amplifier circuit for receiving an input signal for amplification comprising: an input port for receiving a RF input signal; an output port for providing a RF output signal therefrom that is an amplified version of the RF input signal; a control port for receiving a control signal; a supply voltage input port for receiving a supply voltage; a regulator circuit for receiving the supply voltage and for providing a regulated supply voltage in dependence upon at least one of a temperature of the amplifier circuit, the supply voltage, and the regulated supply voltage, where at least one of the temperature signal, the supply voltage and the regulated supply voltage are provided to the regulator circuit using a direct feedback path; at least a first amplification stage and a second amplification stage, the at least a first amplification stage and the second amplification stage coupled to at least one of the supply voltage and the regulated supply voltage, the first amplification stage for receiving one of a signal derived from the RF input signal and the RF input signal and for providing a first amplified signal, to the second amplification stage, the second amplification stage for amplifying a signal derived from the first amplified signal and the first amplified signal to form the RF output signal.

In accordance with the invention there is provided a method of operating a multi stage amplifier circuit comprising the steps of: receiving a RF input signal; receiving a supply voltage; receiving a control signal; receiving at least one of a temperature signal related to a temperature of the amplifier circuit and a sense signal related to the supply voltage; regulating the received supply voltage to form a regulated supply voltage in dependence upon the received at least one of temperature signal and sense signal; providing a first amplification stage having a first gain; providing a second amplification stage having a second gain; providing the regulated supply voltage to at lease one of the first amplification stage and the second amplification stage; and, amplifying one of a signal derived from the received RF input signal and the received RF input signal using the first amplification stage and the second amplification stage to form a RF output signal that is an amplified version of the one of a signal derived from the received RF input signal and the RF input signal.

BRIEF DESCRIPTION OF THE DRAWINGS

Exemplary embodiments of the invention will now be described in conjunction with the following drawings, in which.

DETAILED DESCRIPTION THE INVENTION

Figure 1:
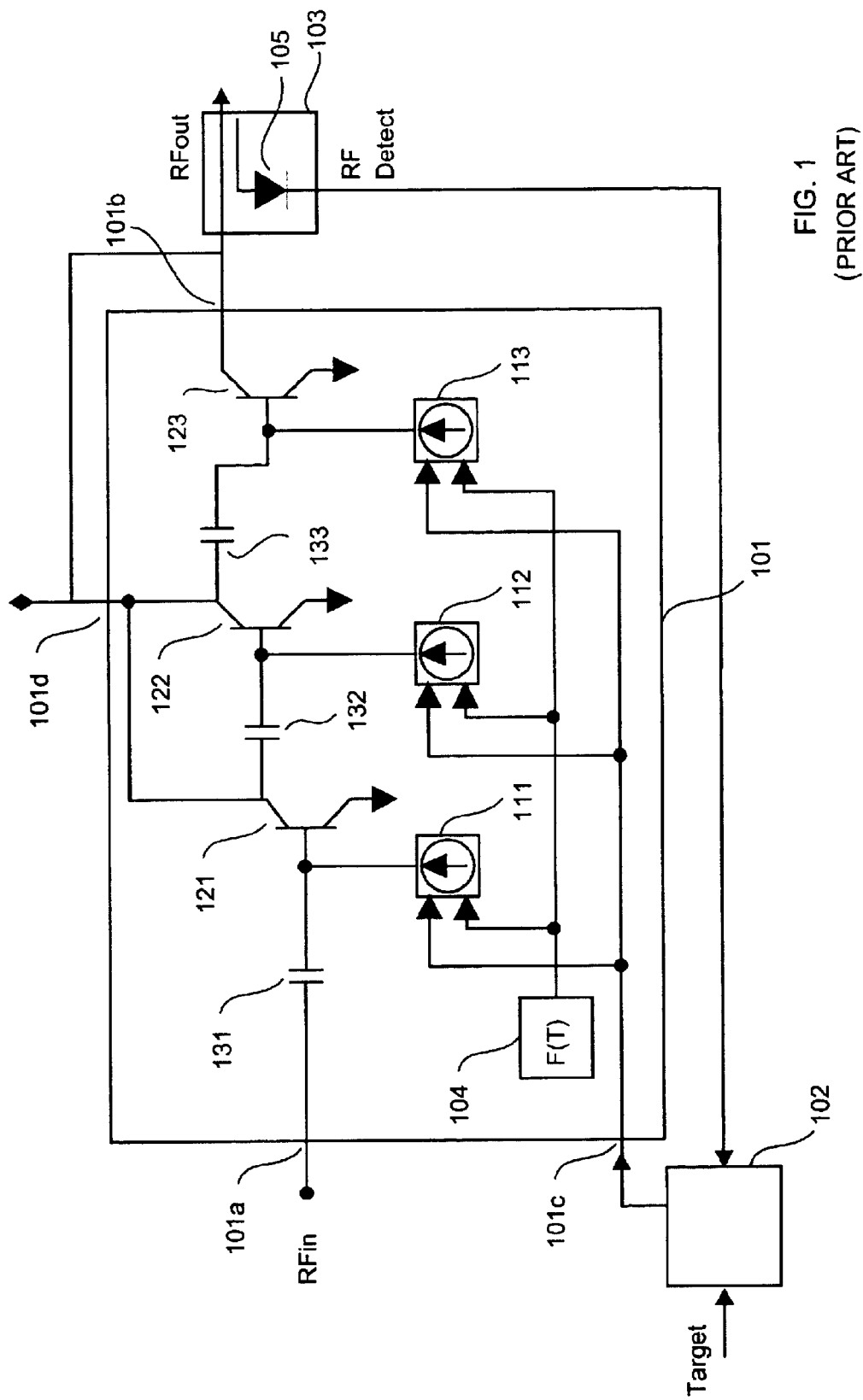
FIG. 1 illustrates a prior art utilizing a power amplifier circuit, an external feedback circuit and an external output power detection circuit.

FIG. 1 illustrates a prior art power amplifier (PA) integrated circuit (IC) (PAIC) 101, a comparator circuit 102, and a RF power detection circuit 103. The PAIC 101 has an input port 101a for receiving a RF input signal, an output port 101b for providing a RF output signal therefrom, a supply voltage input port 101d for receiving a supply voltage and a control port 101c for receiving a control signal. Disposed within the PAIC 101 are a first amplification stage 121, a second amplification stage 122, and a third amplification stage 123. Each amplification stage comprises a transistor having a base terminal coupled to one of an input port and a collector terminal of a previous amplification stage using a capacitor. Capacitor 131 is used to couple the RF input signal to the first amplification stage, and capacitors 132, 133 are used to couple the amplification stages together. Additionally, the first amplification stage 121 has disposed therein a first current source 111, the second amplification stage 122 has disposed therein a second current source 112, and the third amplification stage has disposed therein a third current source 113. The first, second and third current sources are for providing first, second and third bias currents to first, second and third amplification stages. More specifically in this embodiment of a bipolar transistor based amplifier circuit, the first, second and third currents are provided to the base terminals of the first, second and third transistors disposed within the three amplification stages, respectively. An integrated temperature sensing circuit (ITSC) 104 is integrated within the PAIC 101 for sensing a temperature of the die having the PAIC 101 disposed therein and for providing a first temperature signal therefrom, in response to a temperature of the die on which the power amplifier circuit is formed. The first temperature signal is provided to the first current source 111, second current source 112 and third current source 113.

The control input port 101c is coupled to each of the current sources, such that the current sources each receive the control signal therefrom. Each current source is for varying its current provided to its corresponding amplification stage in dependence upon the control signal and the first temperature signal.

Each amplification stage is disposed between the supply voltage input port 101d and a ground potential. A transistor is disposed in each amplification stage with its collector terminal coupled to the supply voltage input port 101d and the emitter terminal thereof coupled to ground. The transistor disposed within the third amplification stage 123 has its collector terminal coupled to the output port 101b and its base terminal capacitvely coupled to the collector terminal of the transistor disposed within the second amplification stage. The transistor disposed in the first amplification stage has its base terminal capacitvely coupled to the input port 101a using capacitor 131. The output port 101b is additionally coupled to the supply voltage input port 101d.

It is often the case that the PAIC 101 is formed on a GaAs substrate, while the RF power detection circuit 103 having a detector diode 105 disposed therein for receiving a portion of the RF output signal current emitted from the PAIC output port 101b, is formed on a silicon substrate. The comparator circuit 102 is formed on a silicon substrate, or on an FR4 glass-fiber type substrate, and is for receiving a diode output voltage proportional to RF output signal power. Unfortunately, at least three different substrates are utilized for implementing of the PAIC 101, the RF power detection circuit, and the feedback circuit 102. Moreover, the bias current sources, and temperature sensing circuits, are often disposed upon another substrate. Thus, bondwires between the substrates are required in the finished device, which increases associated manufacturing costs.

In operation, for stabilizing of the RF output signal power of the PAIC 101, the diode output voltage is compared to a target signal and the comparator circuit 102 provides the control to the control port 101c of the PAIC 101 in response thereto. In dependence upon the control signal, the first, second and third bias currents, and the first temperature signal, the PAIC 101 amplifies the RF input signal based upon a gain of each amplification stage to provide the RF output signal.

Additionally, traditional control characteristics for controlling of the GaAs PA result in large changes in output signal power in dependence upon small changes in control signal voltage. This poses a design challenge in designing a control loop that offers PA stability for various operating temperatures of the PA die. In addition, a tangential response of the diode detector causes the rate of change of diode output signal voltage to be reduced at low RF output signal power levels, which results in timing mask challenges in certain transmit architectures, such as GSM.

Figure 2:
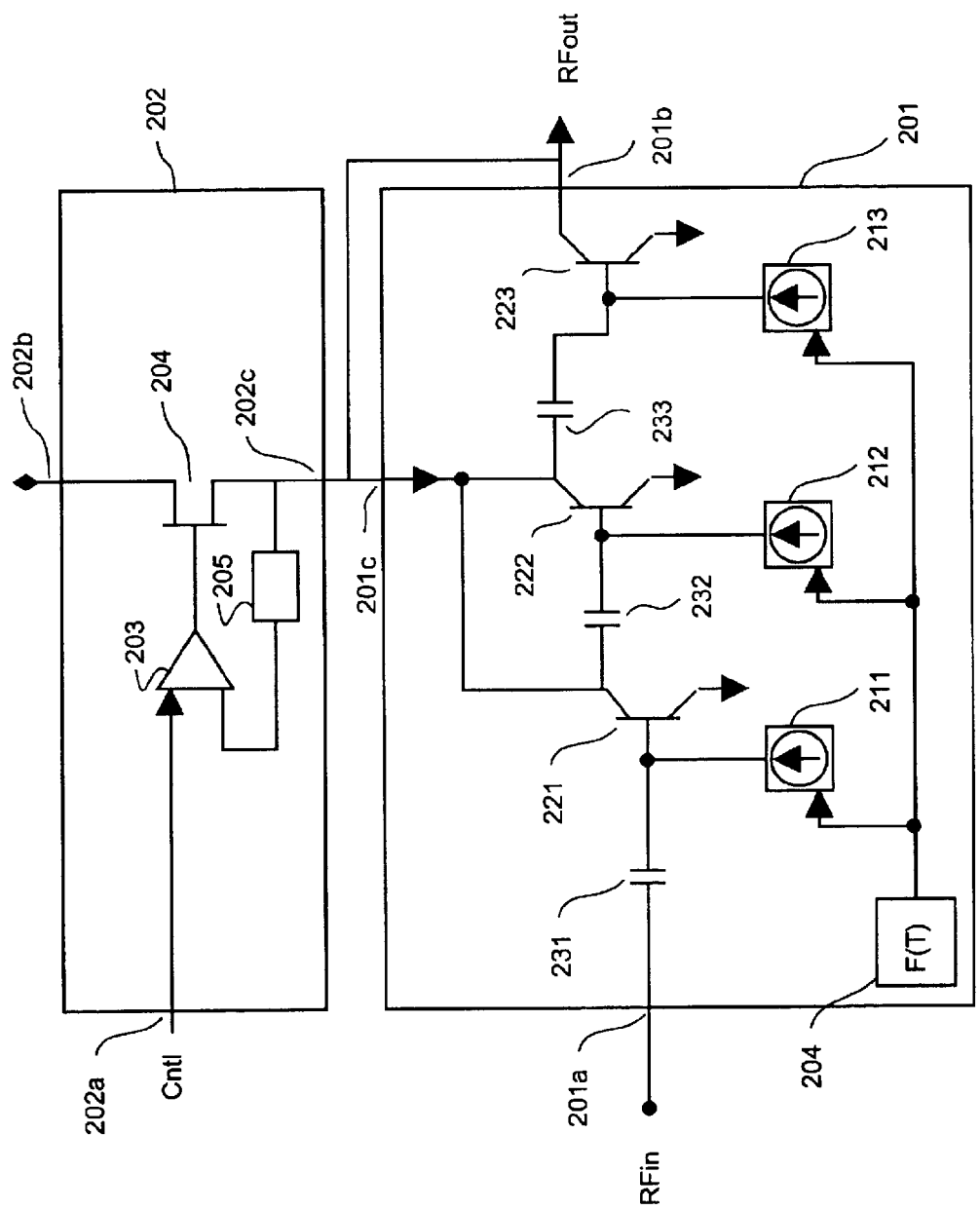
FIG. 2 illustrates a prior art PA circuit utilizing a voltage regulation circuit for controlling an output power of a RF output signal emitted from the PA.

A second prior art architecture, as illustrated in FIG. 2, implements an off-chip voltage regulator circuit 202 for controlling an output power of a RF output signal. A power amplifier integrated circuit 201 is provided with an input port 201a for receiving a RF input signal, an output port 201b for providing a RF output signal therefrom, and a regulated voltage input port 201c for receiving a regulate positive supply voltage from the off-chip voltage regulator circuit 202.

The regulator circuit 202 has a supply voltage input port 202b for receiving a supply voltage from a power supply (not shown) coupled thereto. A control port 202a is disposed on the regulator circuit 202 for receiving a control signal. Within the regulator circuit 202 there is disposed an operational amplifier (OpAmp) 203 having a first input port coupled with the control port 202a for receiving the control signal and an output port of the OpAmp 203 is coupled to a gate terminal of a FET 204. Optionally a difference amplifier is disposed in a similar manner to the OpAmp 203 and replaces the OpAmp 203. Drain and source terminals of the FET 204 are disposed in series between the positive supply voltage input port 202b and a regulated supply voltage output port 202c. A feedback sense circuit 205 is disposed between a second input port of the OpAmp 203 and the regulated supply voltage output port 202c. The regulated supply voltage output port 202c is coupled to the regulated supply voltage input port 201c for receiving the regulated supply voltage from the regulator circuit 202.

Disposed within a same PAIC die 201 are a first amplification stage 221, a second amplification stage 222 and third amplification stage 223. In this embodiment of a power amplifier using bipolar transistors, each amplification stage comprises a transistor having a base terminal coupled to one of an input port and a collector terminal of a previous amplification stage. The amplification stages are capacitively coupled using capacitors 231, 232, 233. Capacitor 231 is used to couple the RF input signal to the first amplification stage 221. Additionally, the first amplification stage 221 has disposed therein a first current source 211, the second amplification stage 222 has disposed therein a second current source 212, and the third amplification stage has disposed therein a third current source 213. An integrated temperature sensing circuit (ITSC) 204 is integrated within the PAIC die 201 for sensing a temperature of the die of the PAIC 201 and for providing a first temperature signal in response to the temperature of the die. The first temperature signal is provided to the first current source 211, the second current source 212 and third current source 213.

Each current source is for varying its bias current provided to each amplification stage in dependence upon the received first temperature signal. Each amplification stage is disposed between the regulated supply voltage input port 201c, for receiving the regulated supply voltage from the regulator circuit 202, and a ground potential. Each transistor within each amplification stage has its collector terminal coupled to the regulated supply voltage input port 201c and the emitter terminal thereof coupled to ground. The transistor forming the third amplification stage 223 has its collector terminal coupled to the PAIC output port 201b. The base terminal of the transistor disposed within the first amplification stage 221 has its base terminal capacitvely coupled to the PAIC input port 201a using capacitor 231. The PAIC output port 201b is additionally coupled to the to the reduced positive supply voltage input port 201c.

The regulator IC 202 employs a low drop out (LDO) regulator circuit in series with a collector terminal of the transistors disposed within the amplification stages of the PAIC 201. The FET 204 disposed within the regulator circuit is typically in the form of a silicon PMOS transistor, which in conjunction with the OpAmp 203, provides specific bandwidth compensated regulated supply voltage to the amplification stages of the PAIC 201. The amplification stages of the PAIC are typically formed on a separate GaAs substrate from the regulator circuit 202. Due to the high saturation current and low ON resistance requirements of the regulator IC 202 for providing a low resistance signal path to the collector terminals of the transistors forming each of the amplification stages, a large area PMOS die is utilized for implementing of the regulator IC 202, resulting in a high manufacturing cost and a high overall module size. Unfortunately, with the size of the regulator circuit IC 202 and regulator IC circuit technology requirements, along with the poor thermal isolation characteristics of the amplification stages, the regulator IC 202 is prevented from being integrated on the same die as the PAIC 202.

Figure 3:
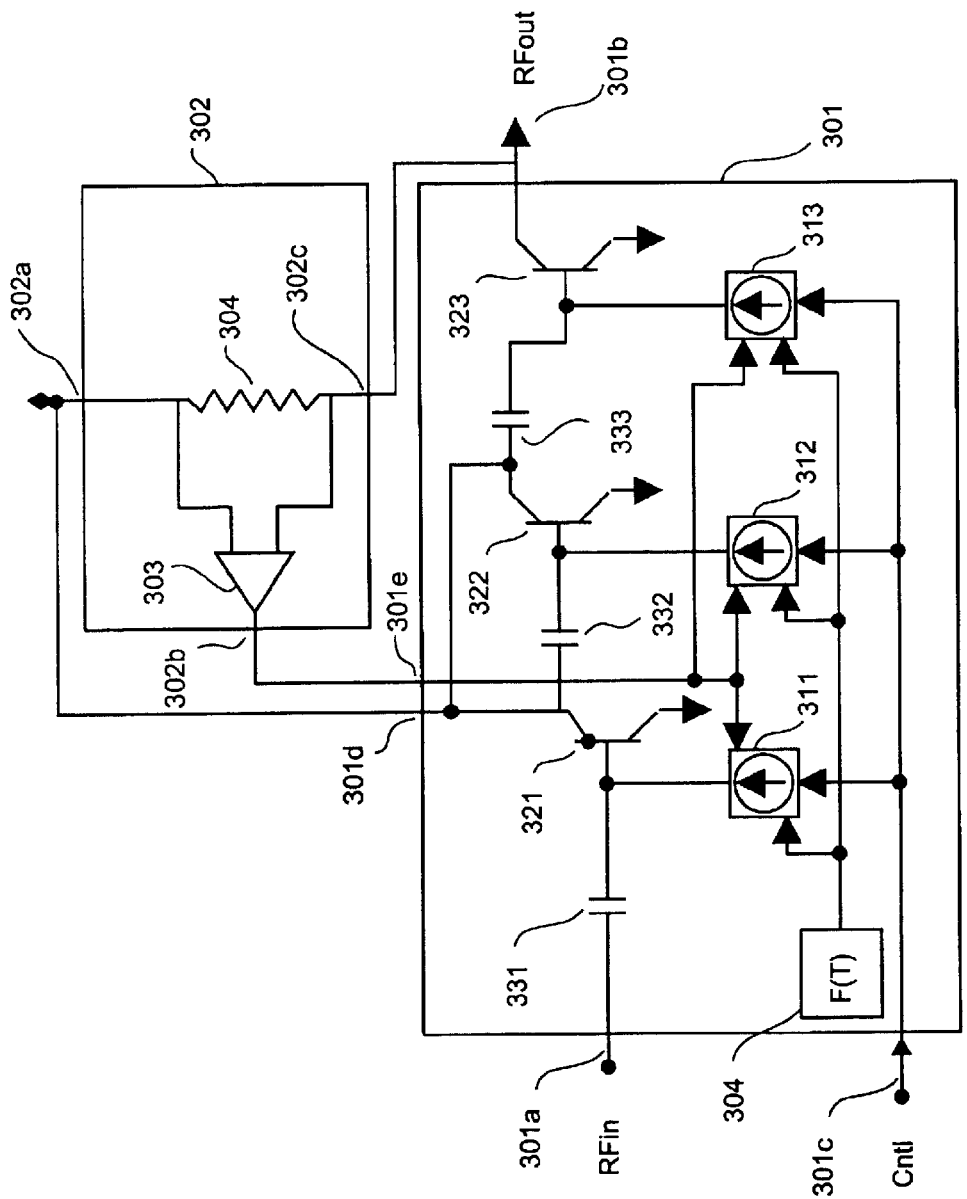
FIG. 3 illustrates a PA circuit that utilizes an external current sensing circuit.

A third prior art architecture, which utilizes an off-chip current sense IC 302 for sensing current consumed by circuit elements forming the PAIC 301, is illustrated in FIG. 3. The sense IC 302 is on a separate die than the PAIC 301. An input port 301a is formed on the PAIC 301 for receiving a RF input signal, an output port 301b is provided for providing an amplified version of the input signal in the form of an amplified RF output signal therefrom, and a voltage input port 301d is disposed on the PAIC for receiving a supply voltage from a power supply (not shown) connected thereto.

The current sense IC 302 is provided with a supply voltage input port 302a for receiving a voltage from a power supply (not shown) coupled thereto. A sense resistor 304 is disposed between the voltage input port 302a and a reduced voltage output port 302c. The reduced voltage output port 302c is coupled to the output port 301b of the PAIC for providing a reduced supply voltage to the third amplification stage. A differential sensing amplifier 303 is disposed within the sense IC 302 and has its input ports disposed in parallel with the sense resistor 304 for measuring a voltage drop thereof. An output port of the differential sensing amplifier 303 is coupled to a sense signal output port 302b for providing a sense signal therefrom. As a third amplification stage 323 draws more current, the voltage drop across the sense resistor increases.

A sense signal input port 301e is also provided for coupling off-chip to the sense signal output port 302b. Disposed within the PAIC 301 are a first amplification stage 321, a second amplification stage 322 and the third amplification stage 323. In this embodiment of a power amplifier using bipolar transistors each amplification stage comprises a transistor having a base terminal capacitively coupled to one of an input port and a collector terminal of a previous amplification stage. Capacitors 331, 332, 333 are provided for facilitating capacitive coupling of the amplification stages. Capacitor 331 is disposed for coupling the RF input signal to the first amplification stage. Additionally, each amplification stage has disposed therein a first current source 311, a second current source 312 and a third current source 313, for providing first, second and third bias currents. The first, second and third bias currents are provided to the base terminals of first, second and third transistors disposed within the three amplification stages. An integrated temperature sensing circuit (ITSC) 304 is integrated within a die of the PAIC 301 for sensing a temperature of the die and for providing a first temperature signal in response to the temperature of the die. The first temperature signal is provided to the first current source 311, second current source 312 and third current source 313. The control port 301c is coupled to each of the current sources for receiving the control signal.

Each current source is for varying the current provided to a respective amplification stage in dependence upon the received temperature signal, the control signal received from a control port 301c, and a sense signal received from the off chip sense IC 302 via the sense signal input port 301e. The first amplification stage 321 and the second amplification stage 322 are disposed between the positive supply voltage input port 301d, for receiving a positive supply voltage from the power supply (not shown) coupled thereto, and ground. A second transistor disposed within the second amplification stage 322 has its collector terminal capacitively coupled, using capacitor 333, to the base terminal of the third transistor disposed within the third amplification stage 323. A collector terminal of a third transistor disposed within the third amplification stage 323 is coupled to the output port 301b and to the reduced voltage output port 302c.

This prior art circuit illustrated in FIG. 3, which utilizes the current sensing approach via the sense resistor 304, also has substantial performance limitations. A first limitation lies in that a voltage drop realized across the sense resistor 304 disposed in the sense IC 302 results in the sensing IC 302 having a loss in operating efficiency for the PAIC 301 for all RF output signal power levels. In order to minimize this inefficiency, the sense resistor 304 has a low resistance value such that a substantial voltage drop is not realized between the DC potential provided to the collector terminals of the transistors and the DC potential provided to the PAIC output port 301b. However, as a result of the resistance value of the sense resistor 304, both tolerance and dynamic range issues associated therewith are relevant to PAIC performance. Furthermore, because of the low resistance value of the sense resistor 304, the manufacturing tolerance results in differences in detected output signal power levels for a given control voltage from one manufactured sense IC unit to another. The small resistance value additionally affects output signal power accuracy at low output signal power levels due to the extremely small voltage drop realized across the sense resistor 304 and the ability of the differential sensing amplifier 303 to measure this voltage drop accurately. As a result of the manufacturing tolerances from sense IC unit to sense IC unit, for a same control signal, a different magnitude sense signal results due to the manufacturing difference in the sense resistances.

Figure 4:
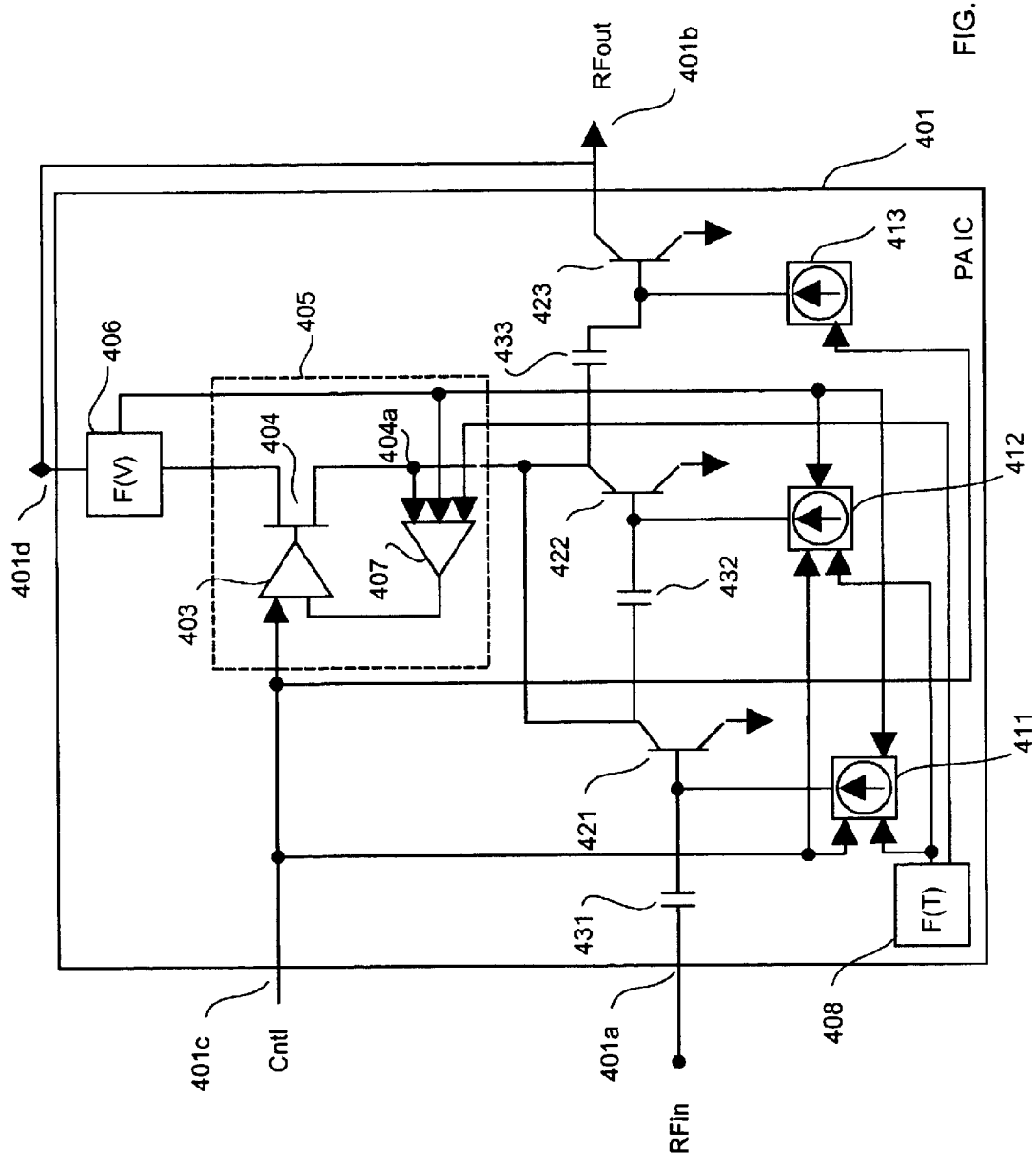
FIG. 4 illustrates a first embodiment of the invention, a Dual Feedback-Low power regulation circuit for a three stage PAIC.

FIG. 4 illustrates a Dual Feedback-Low power regulation circuit for a three-stage power amplifier integrated circuit (PAIC) 401 in accordance with a first embodiment of the invention. The PAIC 401 preferably has integrated therein a regulator circuit 405, in the form of a reduced die area regulator circuit, which is formed within the same die as the PAIC 401. The PAIC 401 is provided with an input port 401a for receiving a RF input signal, an output port 401b for providing a RF output signal, in the form of an amplified version of the RF input signal therefrom, a supply voltage input port 401d for receiving a supply voltage, and a control port 401c for receiving a control signal from an external source (not shown).

A voltage sensing circuit 406 is preferably disposed in series between the voltage input port 401d and the integrated regulator circuit 405, where the integrated regulator circuit is preferably in the form of an integrated compact low dropout (LDO) voltage regulator circuit. Preferably, the voltage sensing circuit 406 is integrated on the same die as the PAIC 401. The integrated regulator circuit 405 receives the supply voltage from the voltage input port 401d and provides a regulated supply voltage therefrom. The voltage sensing circuit 406 provides a voltage sense signal in dependence upon a sensed potential of the supply voltage.

Preferably, within the integrated regulator circuit 405, there is disposed an operational amplifier (OpAmp) 403 having a first input port coupled with the control port 401c for receiving the control signal. Optionally, the OpAmp is replaced with a difference amplifier. An output port of the OpAmp 403 is coupled to a gate terminal of a FET 404. The FET 404 drain and source terminals are disposed in series between the voltage sensing circuit 406 and the junction 404a formed at the collector terminals of a first transistor disposed within a first amplification stage 421 and a second transistor disposed within a second amplification stage 422. A second input port of the OpAmp 403 is coupled to an output port of a first summing circuit 407. A first input port of the first summing circuit 407 is for coupling to the junction 404a formed between one of the drain and source terminals of the FET 404 and the collector terminals of the first and second transistors disposed within the first and second amplification stages, 421 and 422, respectively. A second input port of the first summing circuit 407 is for receiving the voltage sense signal from the voltage sensing circuit 406. Junction 404a receives the regulated supply voltage from the integrated regulator circuit 404.

In addition to the first amplification stage 421 and the second amplification stage 422, a third amplification stage 423 is disposed within the PAIC 401 and integrated therewith on the same die. In this embodiment of a power amplifier circuit using bipolar transistors, each amplification stage comprises a transistor having a base terminal coupled to one of an input port and a collector terminal of a previous amplification stage, using capacitive coupling. Capacitors 431, 432, 433 are provided for facilitating the capacitive coupling. Capacitor 431 is disposed between the input port 401a and the first amplification stage 421 for capacitively coupling of the RF input signal into the PAIC 401, and second and third capacitors 432 and 433 act to capacitively couple the second and third amplification stages together. Additionally, the three amplification stages have disposed therein a first current source 411, a second current source 412 and third current source 413, for providing first, second and third bias currents to the base terminals of first, second and third transistors, respectively. The three amplification stages are thus provided with first, second and third gains, respectively, in response to the first, second and third bias currents.

An integrated temperature sensing circuit (ITSC) 408 is integrated within the same die as the PAIC 401 and is for sensing a temperature of the die and for providing an at least a temperature signal in response to a temperature thereof. The at least a temperature signal is in the form of a first temperature signal and a second temperature signal, where the first temperature signal is provided to the first current source 411 and to the second current source, and where the second temperature signal is provided to a third input port of the first summing circuit 407. The PAIC output port 401b is additionally coupled to the positive voltage input port 401d for receiving a DC bias voltage for biasing of the third transistor collector terminal.

The first, second and third current sources are additionally coupled to the control port 401c for receiving the control signal. The first current source 411 and the second current source 412 are for varying their bias current provided to the first and second amplification stages in dependence upon the received first temperature signal, the voltage sense signal, and the control signal. The third current source 413 is coupled to the control port 401c for preferably having its magnitude varied only in response to the control signal.

To compensate for output signal power due to changes in temperature of the PAIC die, an indirect feedback loop is employed, which compensates the first and second amplification stages for temperature in order to maintain a fixed RF output signal power at the output port 401b. In use, as heating of the die occurs due to the third gain of the third amplification stage, the temperature of the PAIC die increases in response to the power dissipated by the third amplification stage. This change in temperature is reflected in the first and second temperature signals generated by the ITSC 408. Thus, the first and second amplification stages provide a precompensated signal to an input port of the third amplification stage in order to precompensate the input signal to the third amplification stage for both power supply variations and PAIC die temperature variations. Furthermore, if the PAIC die is subject to heating from an external source, then the precompensated signal provided to the third amplification stage is reflective of this heating.

In use, a control signal in the form of a ramp voltage is applied to the control port 401c. The control signal is for achieving a desired target RF output signal power by controlling the first, second and third gains of the amplification stages within the PAIC 401. The ramp voltage provides wide dynamic range performance for the PAIC 401 by varying the gain of the multi-stage PAIC through two means. The primary means of gain control is through variation of the regulated supply voltage provided to junction 404a, based on the control signal received from the control port 401c. The secondary means of gain variation is achieved through modification of the bias currents provided from each of the three current sources 411, 412, and 413, where the three bias currents are proportional to a parameter of the control signal received at the control port 401c. Regulator circuit 405 control of the first amplification stage 421 and second amplification stage 422 provides precise RF signal power control proportional to the square of the voltage on the collector terminals of the first and second transistors. This precisely controlled RF signal power is incident on the third amplification stage 423 and further amplified using the third amplification stage, in a controlled manner, through the action of third current source 413 and third transistor 423. The presence of the regulator circuit 405 results in RF signal power emitted from the first and second amplification stages to be precisely known and independent of supply voltage variations occurring at the supply voltage input port 401d. However, in order to compensate for the effects of supply voltage variation occurring at the third amplification stage, the sense circuit 406 is employed, which provides the sense signal to the first summing circuit 407 disposed in the regulator circuit 405. The input signal provided to the third amplification stage reduces the low dropout (LDO), which maintains the gain of the third stage constant. Sensing the temperature of the PAIC die provides a further compensation factor for the regulator circuit 405. Sensing the temperature removes temperature variation from the RF signal power incident at the third amplification stage 423. Additionally, by optionally providing the temperature signal to the first and second current sources, fine-tuning of the temperature and voltage effects of the PAIC 401 are achieved.

Thus, RF input signal power provided to the third amplification stage is continuously compensated in order to maintain a desired RF output signal power by varying the first and second bias currents as well as the collector terminal voltages using the regulator circuit 405. The third stage transistor base current is slowly varied proportional to the control signal ramp voltage in order to minimize consumed current at low signal powers and to adequately drive the base terminal at high powers, thus achieving the desired dynamic range. This advantageously results in a substantial reduction in die area and module size, by removing the need for regulation of the final power stage as well as simplified calibration requirements for calibrating of the control signal in relation to RF output signal power. Further advantageously, a reduced thermal load is realized and improved PA amplification efficiency is achieved for reduced output signal power levels. The substantial reduction in the die area results from a smaller area FET 404 that is utilized within the regulator circuit 405. The FET 404 is of a smaller size because only the first and second amplification stages are regulated using the regulated supply voltage and not the higher-powered third amplification stage. In regulating the supply voltage to the third amplification stage, much larger area FET devices are used in order to handle the higher power requirements of this third amplification stage. As is known to those of skill in the art, the third, or final amplification stage, typically has a regulated supply voltage provided thereto.

Figure 5:
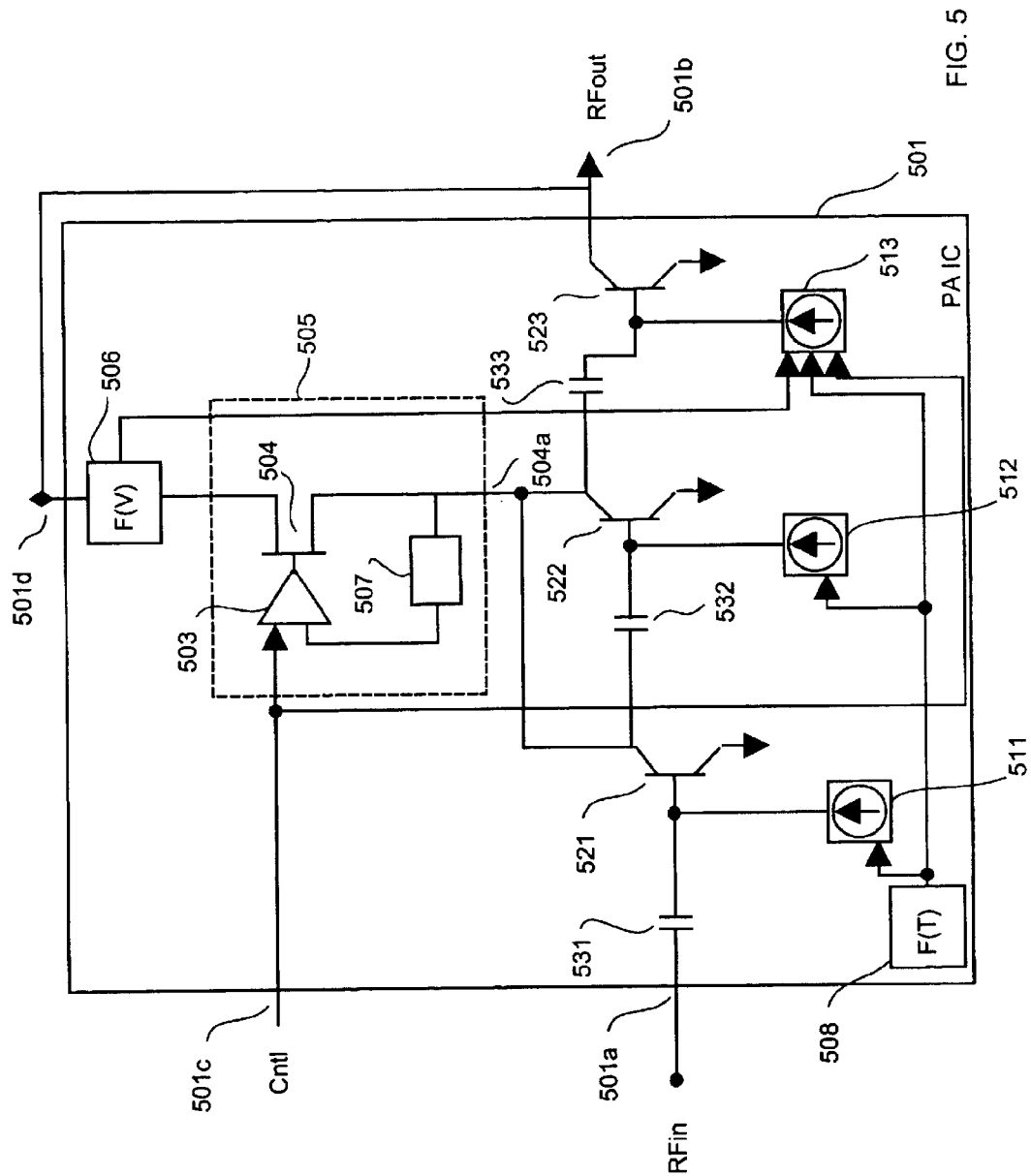
FIG. 5 illustrates a second embodiment of the invention, a three stage RF PA formed in a PAIC with a current source feedback circuit having low RF output signal power regulation; and, FIG. 6 illustrates a third embodiment of the invention, a three stage RF PA formed in a PAIC die in conjunction with an integrated logarithmic detector circuit, integrated into the same die.

FIG. 5 illustrates a current source feedback circuit having low RF output signal power regulation for a three stage power amplifier integrated circuit (PAIC) 501 in accordance with a second embodiment of the invention. The PAIC 501 preferably has integrated therein a regulator circuit 505, in the form of a reduced die area regulator circuit, which is formed within a same substrate as the PAIC 501. The PAIC 501 is provided with a PAIC input port 501a for receiving a RF input signal, a PAIC output port 501b for providing an amplified RF output signal therefrom, a voltage input port 501d for receiving a supply voltage, and a control port 501c for receiving a control signal from an external source (not shown).

A voltage sense circuit 506 is preferably integrated on the same die with the PAIC 501 and disposed in series between the supply voltage input port 501d and the integrated regulator circuit 505. The integrated regulator circuit 505 receives the supply voltage through the supply voltage input port 501d and provides a regulated supply voltage therefrom. The voltage sensing circuit 506 provides a sense signal therefrom.

Within the integrated regulator circuit 505 there is disposed an operational amplifier (OpAmp) 503 having a first input port coupled with the control port 501c for receiving the control signal. Optionally, the OpAmp is replaced with a difference amplifier. An output port of the OpAmp 503 is coupled to a gate terminal of a FET 504. The FET drain and source terminals are disposed in series between the voltage sense circuit 506 and a junction 504a formed between a collector terminal of a first transistor disposed within a first amplification stage 521 and a second transistor is disposed within a second amplification stage 522. A second input port of the OpAmp 503 is coupled to an output port of a feedback sense circuit 507. An input port of the feedback sense circuit 507 is coupled to the junction formed between the collector terminals of the first and second transistors disposed within a first amplification stage and a second amplification stage, respectively, and one of the gate and drain terminals of the FET 504.

In addition to the first amplification stage 521 and the second amplification stage 522, a third amplification stage 523 is disposed within the PAIC 501 and integrated therewith on the same die. Each amplification stage comprises a transistor having a base terminal coupled to one of an input port and a collector terminal of a previous amplification stage using a capacitive coupling. Capacitors 531, 532, 533 are provided for facilitating the capacitive coupling. Capacitor 531 is disposed between the input port 501a and the first amplification stage 521 for capacitively coupling of the RF input signal to the first amplification stage. Additionally, the amplification stages have respectively disposed therein a first current source 511, a second current source 512 and a third current source 513, for providing first, second and third bias currents to the base terminals of first, second and third transistors, respectively. The three amplification stages are thus provided with first, second and third gains, respectively, in response to the first, second and third bias currents.

An integrated temperature sensing circuit (ITSC) 508 is integrated within the die of the PAIC 501 for sensing a temperature of the die and for providing at least a temperature signal therefrom in response to a temperature of the die. The at least a temperature signal is in the form of a first temperature signal, where the first temperature signal is provided to the first current source 511, the second current source 512, and the third current source 513. The third current source 513 is additionally coupled to the control port 501c for receiving the control signal and to the voltage sense circuit 506 for receiving the voltage sense signal. The output port 501b is additionally coupled with the supply voltage input port 501d for receiving a DC bias voltage therefrom for the collector terminal of the third transistor disposed within the third amplification stage 523.

The first and second current sources are for varying their first and second bias current provided to the first and second amplification stages in dependence upon the received first temperature signal. The third current source is for varying its third bias current in dependence upon the first temperature signal, the control signal and the voltage sense signal.

To compensate for RF output signal power variation due to changes in temperature of the PAIC die, a direct feedback path is employed for providing the temperature signal to all three current sources. To compensate for RF output signal power variation due to changes supply voltage, the first and second amplification stages receive the regulated supply voltage. Thus, the first and second amplification stages provide a partially precompensated signal to the third amplification stage. In use, as heating of the die occurs due to the third gain of the third amplification stage, the temperature of the PAIC die increases in response to the power dissipated by the third amplification stage. This change in temperature is reflected in the temperature signal generated by the ITSC 508.

This embodiment also employs a similar technique for compensating of the RF output signal propagating from the third stage as disclosed in the first embodiment, but additionally utilizes a feedback signal, in the form of the voltage sense signal. As implemented in the first embodiment, a ramp voltage is applied to the control port 501c for controlling a magnitude of the third current provided from the third current source 513 to the third amplification stage 523. The voltage sense signal is additionally provided to the third current source for compensating the RF output signal emitted from the third amplification stage for supply voltage variations.

In use, a control signal in the form of a ramp voltage is applied to the control port 501c. The control signal is used for achieving a desired target RF output signal power by controlling the first, second and third gains of the amplification stages within the PAIC 501. The ramp voltage provides wide dynamic range performance for the PAIC 501 by varying the gain of the multi-stage PAIC through two means. The primary means of gain control is through variation of the regulated supply voltage provided to junction 504a, based on the control signal received from the control port 501c. The secondary means of gain control is achieved through modification of the bias currents provided from each of the three current sources 511, 512, and 513, where the three bias currents are proportional to a parameter of the control signal. Regulator circuit 505 control of the first amplification stage 521 and second amplification stage 522 provides precise output power control proportional to the square of the voltage on the collector terminals of the first and second transistors. This precisely controlled RF signal power is incident on the third amplification stage 523 and further amplified using the third amplification stage in a controlled manner through the action of third current source 513 and third transistor 523. The presence of the regulator circuit 505 results in output signal power emitted from the first and second amplification stages to be precisely known and independent of supply voltage variations occurring at the supply voltage input port 501d. However, in order to compensate for the effects of supply voltage variation occurring at the third amplification stage, the sense circuit 506 is employed, which provides the sense signal to the third current source 513 for fine tuning of the third gain. The input signal provided to the third current source reduces the required size of the regulator circuit 505 in the form of a low dropout (LDO) circuit, and maintains the gain of the third stage constant. Sensing the temperature of the PAIC die provides a final compensation factor for three current sources. Sensing the temperature removes temperature variation from the RF signal power emitted from the output port 501b.

This circuit implementation of the second embodiment advantageously results in a substantial reduction in die and module size. The substantial reduction in the die area results from a smaller area FET that is utilized within the regulator circuit. The FET is of a smaller size because only the first and second amplification stages are regulated using the regulated supply voltage and not the higher-powered third amplification stage. Because of reduced current requirements of the first and second amplification stages, the regulator circuit occupies a small die area. It is known to those of skill in the art that in regulating the supply voltage to the third amplification stage, a much larger die area FET is used in order to handle the higher power requirements of the third amplification stage. Furthermore, the second embodiment offers simplified calibration requirements, reduced thermal load, and improved amplification efficiency at reduced RF output signal power levels.

Figure 6:
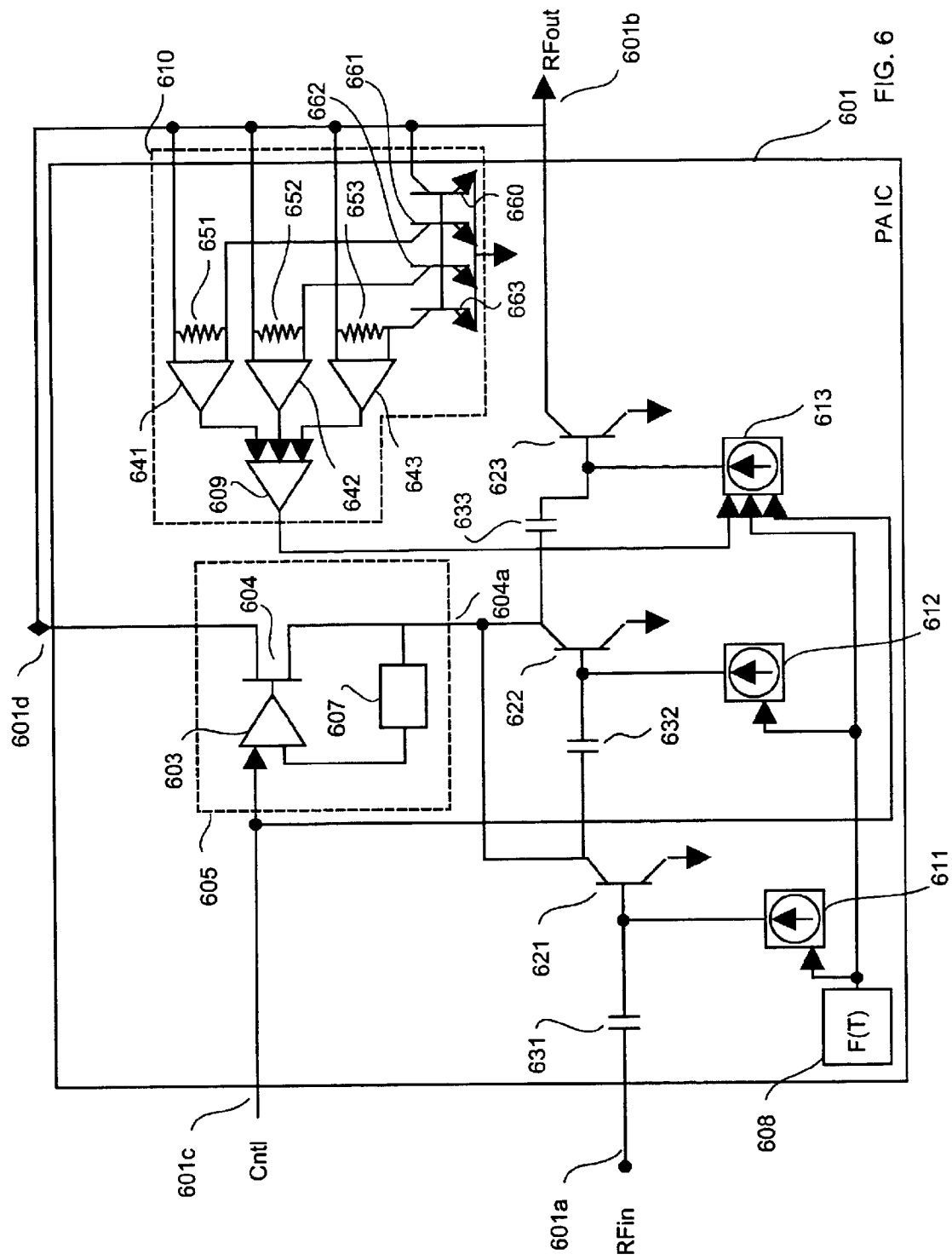

FIG. 6 illustrates a detector circuit, in the form of an integrated logarithmic detector circuit 610, disposed in conjunction with a three stage power amplifier integrated circuit (PAIC) 601 in accordance with a third embodiment of the invention. The third embodiment of the invention has an integrated regulator circuit 605, in the form of a reduced die area regulator circuit, which is formed in a same substrate as the PAIC 601. The PAIC 601 is provided with an input port 601a for receiving a RF input signal, a PAIC output port 601b is for providing an amplified version of the RF input signal in the form of a RF output signal. A supply voltage input port 601d is provided for receiving a supply voltage, and a control port 601c is disposed therein for receiving a control signal from an external source (not shown).

The integrated regulator circuit 605 is preferably integrated with the PAIC 601 and coupled to the supply voltage input port 601d for receiving a supply voltage therefrom from a power supply (not shown) coupled thereto. The integrated regulator circuit 605 provides a regulated supply voltage therefrom to a junction 604a. Within the integrated regulator circuit 605 there is disposed an operational amplifier (OpAmp) 603 having a first input port coupled with the control port 601c for receiving the control signal. An output port of the OpAmp 603 is coupled to a gate terminal of a FET 604. The FET drain and source terminals are disposed in series between the supply voltage input port 601d and collector terminals of a junction 604a formed between collector terminals of a first transistor disposed within a first amplification stage 621 and a second transistor disposed within a second amplification stage 622. A second input port of the OpAmp 603 is coupled to an output port of a feedback sense circuit 607. An input port of the feedback sense circuit 607 is coupled to the junction 604a formed between the collector terminals of the first and second transistors and one of the source and drain terminals of the FET 604.

In addition to the first amplification stage 621 and the second amplification stage 622, a third amplification stage 623 is disposed within the PAIC 601 and integrated therewith on the same die. In this embodiment of a power amplifier using bipolar transistors, each amplification stage comprises a transistor having a base terminal coupled to one of an input port and a collector terminal of a previous amplification stage, using a capacitive coupling. Capacitors 631, 632, 633 are provided for facilitating the capacitive coupling. Capacitor 631 is disposed between the input port 601a and the first amplification stage 621 for capacitively coupling of the RF input signal to the first amplification stage 621. Additionally, the first, second and third amplification stages have disposed therein a first current source 611, a second current source 612 and a third current source 613, respectively, for providing first, second and third bias currents to the base terminals of first, second and third transistors disposed within amplification stages.

An integrated temperature sensing circuit (ITSC) 608 is integrated within the PAIC die 601 for sensing a temperature of the PAIC die 601 and for providing a temperature signal. The temperature signal is provided to the first current source 611, the second current source 612, and to the third current source 613. The third current source 613 is additionally coupled to the control port 601c for receiving the control signal. The output port 601b is additionally coupled with the supply voltage input port 601d for receiving a DC bias voltage therefrom, where this DC bias is provided to a collector terminal of the third transistor disposed within the third amplification stage 623.

The integrated logarithmic detector circuit 610 is coupled to the PAIC output port 601b for receiving a portion of current from the RF output signal. Disposed within the integrated logarithmic detector circuit 610 is a second summing circuit 609 having first, second and third input ports and an output port. The output port of the second summing circuit 609 is coupled to the third current source for providing a feedback signal in the form of an output level signal thereto.

A first difference amplifier 641 is disposed in the integrated logarithmic detector circuit 610 with an output port thereof coupled to the first input port of the second summing circuit 609. Disposed between the input ports of the first difference amplifier circuit 641 is a first sense resistor 651, where a first input port of the first difference amplifier circuit 641 is coupled to the PAIC output port 601b and a second input port of the first difference amplifier circuit 641 is coupled to a collector terminal of a first sense transistor 661 with an emitter terminal thereof coupled to ground. A base terminal of the first sense transistor 661 is coupled to a base terminal of a current mirror transistor 660 having a collector terminal coupled to the PAIC output port 601b and an emitter terminal thereof coupled to ground.

A second difference amplifier circuit 642 is disposed in the integrated logarithmic detector circuit 610 with an output port thereof coupled to the second input port of the second summing circuit 641. Disposed between the input ports of the second difference amplifier 642 is a second sense resistor 652, where a first input port of the second difference amplifier is coupled to the PAIC output port 601b and a second input port of the second difference amplifier 642 is coupled to a collector terminal of a second sense transistor 662 with an emitter terminal thereof coupled to ground. A base terminal of the second sense transistor 662 is also coupled to the base terminal of the current mirror transistor 660.

A third difference amplifier circuit 643 is disposed in the integrated logarithmic detector circuit 610 with an output port thereof coupled to the third input port of the second summing circuit 641. Disposed between the input ports of the third difference amplifier 643 is a third sense resistor 653, where a first input port of the third difference amplifier 643 is coupled to the PAIC output port 601b and a second input port of the third difference amplifier 642 is coupled to a collector terminal of a third sense transistor 663 with an emitter terminal thereof coupled to ground. A base terminal of the third sense transistor 663 is also coupled to the base terminal of the current mirror transistor 660.

The first and second current sources are for varying their bias current provided to the first and second transistors disposed in the first and second amplification stages in dependence upon the temperature signal. The third current source is for varying its third bias current in dependence upon the temperature signal, the control signal, and the feedback signal received from the integrated logarithmic detector circuit 610.

The third embodiment advantageously adds a direct feedback loop based upon RF output signal power detection from the output port 601b. As is illustrated in the first and second embodiments, a voltage regulator circuit provides a regulated supply voltage to the first and second amplification stages to one of the collector and drain terminals of the transistors thereof to compensate for RF signal level changes in supply voltage of the third amplification stage. Thus, the first and second amplification stages are provided with a regulated supply voltage that offers stability during supply voltage variation.

Unlike the first and second embodiments, the third embodiment utilizes the DC coupled sense transistors 661, 662, and 663, and the current mirror transistor 660, selectively embedded in the integrated logarithmic detector circuit 610, to "sense" a portion of the collector current of the third transistor disposed in the third amplification stage 623. The sensed collector current is proportional to RF output signal power. Each of the three current mirror circuits utilizing first, second and third feedback transistors receive input voltages that are proportional to the output RF signal power.

The three current mirror circuits, utilizing sense transistors 661, 662, and 663, employ sense resistors 651, 652, 653 that differ by 3 decades in order to provide RF output signal power sensitivity over a broad dynamic range of operation of the three stage PAIC as shown in the third embodiment. The output signals from the three differential amplifier circuits 641, 642, 643 are advantageously summed together using the second summing circuit 609 for forming the feedback signal that is provided back to the third amplification stage 613 and optionally the first and second amplification stages. Of course, the integrated logarithmic detector circuit is not limited to 3 decades of operation by using three difference amplifiers and three current mirror circuits. Optionally, the integrated logarithmic detector circuit 610 is provided with a plurality of current mirror circuits in dependence upon performance requirements.

To compensate for RF output signal power variation due to changes in temperature of the PAIC die, a direct feedback path is employed for providing the temperature signal to all three current sources. To compensate for RF output signal power variation due to changes supply voltage, the first and second amplification stages receive the regulated supply voltage. Thus, the first and second amplification stages provide a partially precompensated signal to the third amplification stage. In use, as heating of the die occurs due to the third gain of the third amplification stage, the temperature of the PAIC die increases in response to the power dissipated by the third amplification stage. This change in temperature is reflected in the temperature signal generated by the ITSC 608.

In use, a control signal in the form of a ramp voltage is applied to the control port 601c. The control signal is used for achieving a desired target RF output signal power by controlling the first, second and third gains of the amplification stages within the PAIC 601. The ramp voltage provides wide dynamic range performance for the PAIC 601 by varying the gain of the multi-stage PAIC through two means. The primary means of gain control is through variation of the regulated supply voltage provided to junction 604a, based on the control signal received from the control port 601c. The secondary means of gain control is achieved through modification of the bias currents provided from each of the three current sources 611, 612, and 613, where the first two bias currents are proportional to the temperature signal and the third bias current is partially proportional to the control signal. The regulated voltage supply of the first amplification stage 621 and second amplification stage 622 provides precise output power control proportional to the square of the voltage on the collector terminals of the first and second transistors. This precisely controlled RF signal power is incident on the third amplification stage 623 and further amplified using the third amplification stage in a controlled manner through the action of third current source 613 and third transistor 623. The presence of the regulator circuit 605 results in output signal power emitted from the first and second amplification stages to be precisely known and independent of supply voltage variations occurring at the supply voltage input port 501d. However, in order to compensate for the effects of supply voltage variation occurring at the third amplification stage, the feedback signal from the integrated logarithmic detector circuit 610 is provided to the third current source 613 of the third amplification stage 623. The input signal provided to the third current source 613 reduces the die area required by the regulator circuit 605 in the form of a low dropout (LDO) circuit, and maintains the gain of the third stage constant. Sensing the temperature of the PAIC die provides a final compensation factor for three current sources. Sensing the temperature removes temperature variation from the RF signal power emitted from the output port 601b. In the third embodiment, the feedback signal from the integrated logarithmic detector circuit 610 is provided to the third current source 613 because the voltage sensing circuit is not utilized for providing a sense signal to the third current source.

The circuit of the third embodiment advantageously results in a circuit die that provides output signal power detection with the use of the logarithmic detector circuit 610. This advantageously results in a reduced sized die and module size, which offers simplified calibration requirements, reduced thermal load, and improved efficiency at reduced RF output signal power levels. The first and second amplification stages have a regulated supply voltage provided thereto and the third amplification stage has an unregulated supply voltage provided thereto. Thus, since the third amplification stage is unregulated, the die area requirements for the regulator circuit are significantly reduced. This allows integration of the regulator circuit within the same IC as the PAs, without utilizing significant amounts of die area because of the reduced power requirements of the first and second amplification stages. Furthermore, this embodiment overcomes the limitations of existing current sense mechanisms in two ways. First, the use of RF coupled sensing transistors reduces resistive losses in sensing of a portion of the RF output signal power, and secondly, by extending the dynamic range of the sensing scheme with multi-decade sense circuits in parallel.

The embodiments of the invention advantageously provide RF PA circuits that offer precise control of RF output signal power with variable gain control through the control port. The embodiments of the invention permit tight control of RF output signal power versus temperature, RF output signal power versus supply voltage variations, and control of the RF output signal power from a control signal port. Furthermore, the control port provided with the embodiments of the invention support interfacing with a plurality of widely accepted control circuits that are known to those of skill in the art. Advantageously, the embodiments of the invention permit the operational circuits to exist on a single die, thus eliminating the need for coupling between more than one die, which reduces manufacturing costs associated therewith.

Although specific circuit designs are disclosed above, small modifications thereto within the known skill in the art and given the present disclosure are foreseen. For example, sense resistors 651, 652, and 653 may differ in resistance by other than decades. Optionally, more, or less, than three sense resistors are utilized within the logarithmic detection circuit in dependence upon PA performance. Of course, the embodiments of the invention are also applicable for use with LDMOS, and PHEMTs. Further optionally, the feedback schemes generally applies to FET type devices with substitution of voltage sources for current sources, where the embodiments of the invention are directed towards current sources. Though the embodiments of the invention are shown with NPN transistors, PNP transistors are also useable.

The embodiments of the invention as described are directed towards power control of the power amplifier. However, the embodiments of the invention are not limited to power amplifier control. The ideas and concepts disclosed in these embodiments are equally applicable to controlling other power amplifier figures of merit, such as output signal harmonic content, linearity, spectral purity, and distortion.

Numerous other embodiments may be envisaged without departing from the spirit or scope of the invention.

What is claimed is:

1. A power amplifier circuit for receiving an input signal for amplification comprising:

an input port for receiving a RF input signal;

an output port for providing a RF output signal therefrom that is an amplified version of the RF input signal;

a control port for receiving a control signal;

a supply voltage input port for receiving a supply voltage;

a regulator circuit for receiving the supply voltage and for providing a regulated supply voltage in dependence upon at least one of a temperature of the amplifier circuit, the supply voltage, and the regulated supply voltage, where at least one of the temperature signal, the supply voltage and the regulated supply voltage are provided to the regulator circuit using a direct feedback path;

at least a first amplification stage and a second amplification stage, the at least a first amplification stage and the second amplification stage coupled to at least one of the supply voltage and the regulated supply voltage, the first amplification stage for receiving one of a signal derived from the RF input signal and the RF input signal and for providing a first amplified signal, to the second amplification stage, the second amplification stage for amplifying a signal derived from the first amplified signal and the first amplified signal to form the RF output signal; and, a temperature sensing circuit for sensing a temperature of the power amplifier circuit and for providing a temperature signal in dependence thereon, the regulator circuit for receiving the temperature signal and for adjusting the regulated supply voltage in dependence thereon.

2. A power amplifier circuit according to claim 1, comprising a voltage sensing circuit for sensing a potential of the supply voltage and for providing a sense signal in dependence thereon, the sense signal for being received by the regulator circuit for adjusting the regulated supply voltage in dependence thereon.

3. A power amplifier circuit according to claim 2, wherein the regulator circuit comprises a FET having one of the drain and source terminals coupled to the supply voltage input port for receiving the supply voltage and the other of the drain and source terminals coupled to the first amplification stage for providing of the regulated supply voltage.

4. A power amplifier circuit according to claim 3, wherein the regulator circuit comprises an operational amplifier circuit, the operational amplifier circuit having a first input port, a second input port and an output port, the first input port thereof coupled to the control port for receiving the control signal and the output port thereof coupled to a gate terminal of the FET.

5. A power amplifier circuit according to claim 4, comprising a first summing circuit having an output port, a first input port, a second input port and a third input port, the output port thereof coupled to the second input port of the operational amplifier circuit, the first input port thereof coupled to one of the drain and source terminals of the FET for receiving the regulated supply voltage, the second input port thereof coupled to the voltage sensing circuit for receiving the sense signal, and the third input port thereof coupled to the temperature sensing circuit for receiving the temperature signal therefrom.

6. A power amplifier circuit according to claim 4, comprising a feedback sense circuit disposed between one of the drain and source terminals of the FET and the second input port of the operational amplifier circuit, the feedback sense circuit for sensing the regulated supply voltage from the FET.

7. A power amplifier circuit according to claim 6, wherein the feedback sense circuit comprises a voltage divider circuit.

8. A power amplifier circuit according to claim 6, wherein the feedback sense circuit comprises an amplitude shifting circuit.

9. A power amplifier circuit according to claim 6, wherein the feedback sense circuit is integrated on a same die as the power amplifier circuit.

10. A power amplifier circuit according to claim 2, wherein the voltage regulator circuit is integrated on a same die as the power amplifier circuit.

11. An amplifier circuit for receiving an input signal for amplification comprising:

an input port for receiving a RF input signal;

an output port for providing a RF output signal therefrom that is an amplified version of the RF input signal;

a control port for receiving a control signal;

a supply voltage input port for receiving a supply voltage;

a regulator circuit for receiving the supply voltage and for providing a regulated supply voltage in dependence upon at least one of a temperature of the amplifier circuit, the supply voltage, and the regulated supply voltage, where at least one of the temperature signal, the supply voltage and the regulated supply voltage are provided to the regulator circuit using a direct feedback path;

at least a first amplification stage and a second amplification stage, the at least a first amplification stage and the second amplification stage coupled to at least one of the supply voltage and the regulated supply voltage, the first amplification stage for receiving one of a signal derived from the RF input signal and the RF input signal and for providing a first amplified signal, to the second amplification stage, the second amplification stage for amplifying a signal derived from the first amplified signal and the first amplified signal to form the RF output signal; and, a detector circuit having an input port coupled to the power amplifier circuit output port for determining a RF output signal power level and having an output port for providing an output level signal to at least one of the first amplification stage and the second amplification stage.

12. An amplifier circuit for receiving an input signal for amplification comprising:

an input port for receiving a RF input signal;

an output port for providing a RF output signal therefrom that is an amplified version of the RF input signal;

a control port for receiving a control signal;

a supply voltage input port for receiving a supply voltage;

a regulator circuit for receiving the supply voltage and for providing a regulated supply voltage in dependence upon at least one of a temperature of the amplifier circuit, the supply voltage, and the regulated supply voltage, where at least one of the temperature signal, the supply voltage and the regulated supply voltage are provided to the regulator circuit using a direct feedback path;

at least a first amplification stage and a second amplification stage, the at least a first amplification stage and the second amplification stage coupled to at least one of the supply voltage and the regulated supply voltage, the first amplification stage for receiving one of a signal derived from the RF input signal and the RF input signal and for providing a first amplified signal, to the second amplification stage, the second amplification stage for amplifying a signal derived from the first amplified signal and the first amplified signal to form the RF output signal; and, a detector circuit having an input port coupled to the power amplifier circuit output port for determining a RF output signal power level and having an output port for providing an output level signal to the first amplification stage.

13. An amplifier circuit for receiving an input signal for amplification comprising:
an input port for receiving a RF input signal;
an output port for providing a RF output signal therefrom that is an amplified version of the RF input signal;
a control port for receiving a control signal;
a supply voltage input port for receiving a supply voltage;
a regulator circuit for receiving the supply voltage and for providing a regulated supply voltage in dependence upon at least one of a temperature of the amplifier circuit, the supply voltage, and the regulated supply voltage, where at least one of the temperature signal, the supply voltage and the regulated supply voltage are provided to the regulator circuit using a direct feedback path;
at least a first amplification stage and a second amplification stage, the at least a first amplification stage and the second amplification stage coupled to at least one of the supply voltage and the regulated supply voltage, the first amplification stage for receiving one of a signal derived from the RF input signal and the RF input signal and for providing a first amplified signal, to the second amplification stage, the second amplification stage for amplifying a signal derived from the first amplified signal and the first amplified signal to form the RF output signal; and,
a detector circuit having an input port coupled to the power amplifier circuit output port for determining a RF output signal power level and having an output port for providing an output level signal to the second amplification stage.

14. An amplifier circuit for receiving an input signal for amplification comprising:
an input port for receiving a RF input signal;
an output port for providing a RF output signal therefrom that is an amplified version of the RF input signal;
a control port for receiving a control signal;
a supply voltage input port for receiving a supply voltage;
a regulator circuit for receiving the supply voltage and for providing a regulated supply voltage in dependence upon at least one of a temperature of the amplifier circuit, the supply voltage, and the regulated supply voltage, where at least one of the temperature signal, the supply voltage and the regulated supply voltage are provided to the regulator circuit using a direct feedback path;
at least a first amplification stage and a second amplification stage, the at least a first amplification stage and the second amplification stage coupled to at least one of the supply voltage and the regulated supply voltage, the first amplification stage for receiving one of a signal derived from the RF input signal and the RF input signal and for providing a first amplified signal, to the second amplification stage, the second amplification stage for amplifying a signal derived from the first amplified signal and the first amplified signal to form the RF output signal; and,
a detector circuit having an input port coupled to the power amplifier circuit output port for determining a RF output signal power level and having an output port for providing an output level signal.

15. A power amplifier circuit according to claim 11, wherein the detector circuit is integrated on a same die as the power amplifier circuit.

16. A power amplifier circuit according to claim 11, wherein the detector circuit comprises at least a difference amplifier circuit having a first input port, a second input port and an output port, the first input port coupled to the detector circuit input port and the second input port for receiving a current mirrored from the RF output signal current.

17. A power amplifier circuit according to claim 16, wherein the detector circuit comprises a second summing circuit having at least an input port and an output port, the at least an input port thereof coupled to the output port of the at least a difference amplifier circuit, the output port thereof coupled to at least one of the first amplification stage and the second amplification stage.

18. A power amplifier circuit according to claim 17, wherein the detector circuit comprises:
at least a sense transistor having one of the emitter and collector terminals thereof coupled to ground and the other one of the emitter and collector terminals coupled to the second input port of the at least a difference amplifier circuit;
at least a sense resistor disposed in parallel with the first and second input ports of the at least a difference amplifier circuit; and,
a mirror transistor, the mirror transistor having one of the emitter and collector terminals thereof coupled to ground and the other one of the emitter and collector terminals coupled to the input port of the detector circuit, a base terminal of the current mirror transistor is coupled to a base terminal of the at least a sense transistor, where the mirror transistor is
for current mirroring RF output signal current.

19. An amplifier circuit for receiving an input signal for amplification comprising:
an input port for receiving a RF input signal;
an output port for providing a RF output signal therefrom that is an amplified version of the RF input signal;
a control port for receiving a control signal;
a supply voltage input port for receiving a supply voltage;
a regulator circuit for receiving the supply voltage and for providing a regulated supply voltage in dependence upon at least one of a temperature of the amplifier circuit, the supply voltage, and the regulated supply voltage, where at least one of the temperature signal, the supply voltage and the regulated supply voltage are provided to the regulator circuit using a direct feedback path;
at least a first amplification stage and a second amplification stage, the at least a first amplification stage and the second amplification stage coupled to at least one of the supply voltage and the regulated supply voltage, the first amplification stage for receiving one of a signal derived from the RF input signal and the RF input signal and for providing a first amplified signal, to the second amplification stage, the second amplification stage for amplifying a signal derived from the first amplified signal and the first amplified signal to form the RF output signal,
wherein each amplification stage of the amplifier circuit comprises:
at least a transistor having one of the emitter and collector terminals coupled to one of the supply voltage and regulated supply voltage and the other one of the emitter and collector terminals coupled to ground; and,
at least a current source coupled to a base terminal of the at least a transistor.

20. A power amplifier circuit according to claim 2, wherein the voltage sensing circuit and the temperature sensing circuit and the first amplification stage and the second amplification stage are integrated on a same die.

21. A method of operating a multi stage amplifier circuit comprising:

receiving a RF input signal;

receiving a supply voltage;

receiving a control signal;

receiving at least one of a temperature signal related to a temperature of the amplifier circuit and a sense signal related to the supply voltage;

regulating the received supply voltage to form a regulated supply voltage in dependence upon the received at least one of temperature signal and sense signal;

providing a first amplification stage having a first gain;

providing a second amplification stage having a second gain;

providing the regulated supply voltage to at lease one of the first amplification stage and the second amplification stage; and, amplifying one of a signal derived from the received RF input signal and the received RF input signal using the first amplification stage and the second amplification stage to form a RF output signal that is an amplified version of the one of a signal derived from the received RF input signal and the RF input signal, wherein the first amplification stage is compensated for temperature and supply voltage fluctuation and the second amplification stage is compensated for control signal.

22. A method of operating a multi stage amplifier circuit comprising:

receiving a RF input signal;

receiving a supply voltage;

receiving a control signal;

receiving at least one of a temperature signal related to a temperature of the amplifier circuit and a sense signal related to the supply voltage;

regulating the received supply voltage to form a regulated supply voltage in dependence upon the received at least one of temperature signal and sense signal;

providing a first amplification stage having a first gain;

providing a second amplification stage having a second gain;

providing the regulated supply voltage to at lease one of the first amplification stage and the second amplification stage; and, amplifying one of a signal derived from the received RF input signal and the received RF input signal using the first amplification stage and the second amplification stage to form a RF output signal that is an amplified version of the one of a signal derived from the received RF input signal and the RF input signal, wherein the first amplification stage is compensated for temperature and the second amplification stage is compensated for control signal and supply voltage fluctuations and temperature.

23. A method of operating a multi stage amplifier circuit comprising:

receiving a RF input signal;

receiving a supply voltage;

receiving a control signal;

receiving at least one of a temperature signal related to a temperature of the amplifier circuit and a sense signal related to the supply voltage;

regulating the received supply voltage to form a regulated supply voltage in dependence upon the received at least one of temperature signal and sense signal;

providing a first amplification stage having a first gain;

providing a second amplification stage having a second gain;

providing the regulated supply voltage to at lease one of the first amplification stage and the second amplification stage; and, amplifying one of a signal derived from the received RF input signal and the received RF input signal using the first amplification stage and the second amplification stage to form a RF output signal that is an amplified version of the one of a signal derived from the received RF input signal and the RF input signal, wherein the first amplification stage is compensated for temperature and the second amplification stage is compensated for control signal and temperature.

24. A method of operating a multi stage amplifier circuit comprising:

receiving a RF input signal;

receiving a supply voltage;

receiving a control signal;

receiving at least one of a temperature signal related to a temperature of the amplifier circuit and a sense signal related to the supply voltage;

regulating the received supply voltage to form a regulated supply voltage in dependence upon the received at least one of temperature signal and sense signal;

providing a first amplification stage having a first gain;

providing a second amplification stage having a second gain;

providing the regulated supply voltage to at lease one of the first amplification stage and the second amplification stage;

amplifying one of a signal derived from the received RF input signal and the received RF input signal using the first amplification stage and the second amplification stage to form a RF output signal that is an amplified version of the one of a signal derived from the received RF input signal and the RF input signal; and, varying of the first gain in dependence upon the control signal.

25. A method of operating a multi stage amplifier circuit comprising:

receiving a RF input signal;

receiving a supply voltage;

receiving a control signal;

receiving at least one of a temperature signal related to a temperature of the amplifier circuit and a sense signal related to the supply voltage;

regulating the received supply voltage to form a regulated supply voltage in dependence upon the received at least one of temperature signal and sense signal;

providing a first amplification stage having a first gain;

providing a second amplification stage having a second gain;

providing the regulated supply voltage to at lease one of the first amplification stage and the second amplification stage; and, amplifying one of a signal derived from the received RF input signal and the received RF input signal using the first amplification stage and the second amplification stage to form a RF output signal that is an amplified version of the one of a signal derived from the received RF input signal and the RF input signal, wherein receiving of a regulated supply voltage comprises varying the regulated supply voltage in dependence upon the temperature signal.

26. A method of operating a multi stage amplifier circuit comprising:

receiving a RF input signal;

receiving a supply voltage;

receiving a control signal;

receiving at least one of a temperature signal related to a temperature of the amplifier circuit and a sense signal related to the supply voltage;

regulating the received supply voltage to form a regulated supply voltage in dependence upon the received at least one of temperature signal and sense signal;

providing a first amplification stage having a first gain;

providing a second amplification stage having a second gain;

providing the regulated supply voltage to at lease one of the first amplification stage and the second amplification stage; and, amplifying one of a signal derived from the received RF input signal and the received RF input signal using the first amplification stage and the second amplification stage to form a RF output signal that is an amplified version of the one of a signal derived from the received RF input signal and the RF input signal, wherein receiving of a regulated supply voltage comprises varying the regulated supply voltage in dependence upon the sense signal.

27. A method of operating a multi stage amplifier circuit comprising:

receiving a RF input signal;

receiving a supply voltage;

receiving a control signal;

receiving at least one of a temperature signal related to a temperature of the amplifier circuit and a sense signal related to the supply voltage;

regulating the received supply voltage to form a regulated supply voltage in dependence upon the received at least one of temperature signal and sense signal;

providing a first amplification stage having a first gain;

providing a second amplification stage having a second gain;

providing the regulated supply voltage to at lease one of the first amplification stage and the second amplification stage;

amplifying one of a signal derived from the received RF input signal and the received RF input signal using the first amplification stage and the second amplification stage to form a RF output signal that is an amplified version of the one of a signal derived from the received RF input signal and the RF input signal; and varying the first gain of the first amplification stage in dependence upon the sense signal.

28. A method of operating a multi stage amplifier circuit comprising:

receiving a RF input signal;

receiving a supply voltage;

receiving a control signal;

receiving at least one of a temperature signal related to a temperature of the amplifier circuit and a sense signal related to the supply voltage;

regulating the received supply voltage to form a regulated supply voltage in dependence upon the received at least one of temperature signal and sense signal;

providing a first amplification stage having a first gain;

providing a second amplification stage having a second gain;

providing the regulated supply voltage to at lease one of the first amplification stage and the second amplification stage;

amplifying one of a signal derived from the received RF input signal and the received RF input signal using the first amplification stage and the second amplification stage to form a RF output signal that is an amplified version of the one of a signal derived from the received RF input signal and the RF input signal; receiving the regulated supply voltage;

summing the received portion of the regulated supply voltage and the sense signal and the temperature signal; and, varying the regulated supply voltage in dependence upon the step of summing.

29. A method of operating a multi stage amplifier circuit comprising:

receiving a RF input signal;

receiving a supply voltage;

receiving a control signal;

receiving at least one of a temperature signal related to a temperature of the amplifier circuit and a sense signal related to the supply voltage;

regulating the received supply voltage to form a regulated supply voltage in dependence upon the received at least one of temperature signal and sense signal;

providing a first amplification stage having a first gain;

providing a second amplification stage having a second gain;

providing the regulated supply voltage to at lease one of the first amplification stage and the second amplification stage;

amplifying one of a signal derived from the received RF input signal and the received RF input signal using the first amplification stage and the second amplification stage to form a RF output signal that is an amplified version of the one of a signal derived from the received RF input signal and the RF input signal;

detecting the RF output signal power level to provide an output level signal; and, providing the output level signal to the first amplification stage.

30. A method according to claim 29, comprising the step of varying the first gain of the first amplification stage in dependence upon the output level signal.

31. A method according to claim 29, wherein the step of detecting comprises:

current mirroring the RF output signal current to form a RF output signal mirror current; and, logarithmically amplifying the RF output signal mirror current to provide the output level signal to the first amplification stage.

32. A method of operating a multi stage amplifier circuit comprising:

receiving a RF input signal;

receiving a supply voltage;

receiving a control signal;

receiving at least one of a temperature signal related to a temperature of the amplifier circuit and a sense signal related to the supply voltage;

regulating the received supply voltage to form a regulated supply voltage in dependence upon the received at least one of temperature signal and sense signal;

providing a first amplification stage having a first gain;

providing a second amplification stage having a second gain;

providing the regulated supply voltage to at lease one of the first amplification stage and the second amplification stage;

amplifying one of a signal derived from the received RF input signal and the received RF input signal using the first amplification stage and the second amplification stage to form a RF output signal that is an amplified version of the one of a signal derived from the received RF input signal and the RF input signal;

detecting the RF output signal power level to provide an output level signal; and, providing the output level signal to the second amplification stage.

33. A method according to claim 32, comprising the step of varying the second gain of the second amplification stage in dependence upon the output level signal.

34. A method according to claim 32, wherein the step of detecting comprises:

current mirroring the RF output signal current to form a RF output signal mirror current; and, logarithmically amplifying the RF output signal mirror current to provide the output level signal to the second amplification stage.

35. A method according to claim 32, wherein the step of detecting comprises:

detecting a first RF output signal power level to provide a first output level signal;

detecting a second RF output signal power level to provide a second output level signal;

summing the detected first output level signal and the detected second output level signal to form a summed signal; and, providing the output level signal in dependence upon the summed signal.

36. A method according to claim 32, wherein the step of detecting comprises:

providing a first resistor having a first resistance;

detecting a first mirror current from the RF output current using the first resistance of the first resistor;

providing a second resistor having a second resistance;

detecting of a second mirror current from the RF output using the second resistance of the second resistor;

summing the detected first mirror current and the detected second mirror current to provide a summed signal; and, forming the output level signal in dependence upon the summed signal.

37. A power amplifier circuit according to claim 19, wherein the at least a current source is integrated on a same die as the power amplifier circuit.

* * * * *